United States Patent
Goncharov et al.

(10) Patent No.: US 10,702,953 B2
(45) Date of Patent: Jul. 7, 2020

(54) COMPOSITE WELDING WIRE AND METHOD OF MANUFACTURING

(71) Applicant: Liburdi Engineering Limited, Dundas (CA)

(72) Inventors: Alexander B Goncharov, Toronto (CA); Joseph Liburdi, Dundas (CA); Paul Lowden, Cambridge (CA); Scott Hastie, Toronto (CA)

(73) Assignee: Liburdi Engineering Limited, Dundas, Ontario ( * ) Notice: Subject to any disclaimer, the term of this patent is extended or adjusted under 35 U.S.C. 154(b) by 386 days.

(21) Appl. No.: 15/674,888

(22) Filed: Aug. 11, 2017

(65) Prior Publication Data
US 2020/0156191 A1    May 21, 2020

Related U.S. Application Data

(63) Continuation-in-part of application No. 14/515,001, filed on Oct. 15, 2014, now abandoned.

(51) Int. Cl.
*B23K 35/22* (2006.01)
*B23K 35/30* (2006.01)
(Continued)

(52) U.S. Cl.
CPC .......... *B23K 35/0261* (2013.01); *B05D 1/007* (2013.01); *B05D 3/002* (2013.01);
(Continued)

(58) Field of Classification Search
CPC ..... B23K 35/22; B23K 35/30–35/3033; B23K 35/406–35/408
See application file for complete search history.

(56) References Cited

U.S. PATENT DOCUMENTS 2,515,185 A    7/1950    Bieber
4,153,483 A    5/1979    Holzl
(Continued)

FOREIGN PATENT DOCUMENTS

CA    1207137    7/1986
CA    2442335    9/2003
(Continued)

OTHER PUBLICATIONS

Improving Repair Quality of Turbine Nozzles Using SA650 Braze Alloy; Demo, Wayne, et al.; Minerals, Metals & Materials society, 2000.
(Continued)

*Primary Examiner* — Michael A Laflame, Jr.
(74) *Attorney, Agent, or Firm* — Ridout & Maybee LLP

(57) ABSTRACT

The present invention is a composite welding wire for fusion welding of components manufactured of superalloys. The composite weld wire includes a surface layer applied to the core wire in a green condition and bonded to the core wire. The surface layer includes alloying elements selected from among B and Si, the total bulk content of B and Si representing 0.5 to 4.0 wt. % of the composite welding wire. The boron and silicon alloying elements reduce the melting temperature and increase the solidification range of the weld pool, minimizing the incidence of weld cracking compared to welding without the coating. The green condition surface layer is comprised of more than 80 wt. % of the bulk content of the composite welding wire selected from the combination of B and Si.

24 Claims, 13 Drawing Sheets

(51) Int. Cl.
  B23K 35/02    (2006.01)
  B05D 7/20     (2006.01)
  B23K 35/36    (2006.01)
  B23K 35/365   (2006.01)
  C23C 14/28    (2006.01)
  C23C 14/02    (2006.01)
  C23C 14/58    (2006.01)
  C23C 16/02    (2006.01)
  C23C 16/44    (2006.01)
  C23C 16/56    (2006.01)
  B05D 1/00     (2006.01)
  B05D 3/00     (2006.01)
  B05D 3/02     (2006.01)

(52) U.S. Cl.
  CPC ............ *B05D 3/0254* (2013.01); *B05D 7/20* (2013.01); *B23K 35/3033* (2013.01); *B23K 35/3046* (2013.01); *B23K 35/3053* (2013.01); *B23K 35/365* (2013.01); *B23K 35/3612* (2013.01); *C23C 14/021* (2013.01); *C23C 14/28* (2013.01); *C23C 14/5806* (2013.01); *C23C 16/0227* (2013.01); *C23C 16/44* (2013.01); *C23C 16/56* (2013.01)

(56) References Cited

U.S. PATENT DOCUMENTS

| | | |
|---|---|---|
| 4,213,026 A | 7/1980 | Duvall |
| 4,685,985 A | 8/1987 | Bueker |
| 4,994,640 A | 2/1991 | Shaw |
| 5,156,321 A | 10/1992 | Liburdi |
| 5,332,628 A | 7/1994 | Chi |
| 5,455,068 A | 10/1995 | Silverberg |
| 5,575,933 A | 11/1996 | Ni |
| 5,897,801 A | 4/1999 | Smashey et al. |
| 6,263,158 B1 | 7/2001 | Campbell |
| 6,659,332 B2 | 12/2003 | Smashey et al. |
| 2010/0310763 A1 | 12/2010 | Empie |
| 2011/0171485 A1* | 7/2011 | Kawamoto ........ B23K 35/0266 428/576 |
| 2013/0161303 A1* | 6/2013 | Kasai ..................... B23K 35/22 219/137 WM |
| 2014/0050912 A1 | 2/2014 | Bernatz |
| 2016/0236302 A1* | 8/2016 | Ogborn ............. B23K 35/3053 |
| 2018/0339370 A1* | 11/2018 | Yamakami ......... B23K 35/0266 |

FOREIGN PATENT DOCUMENTS

| | | |
|---|---|---|
| CN | 1822246 A | 8/2006 |
| CN | 1408501 | 11/2006 |
| CN | 101244489 A | 8/2009 |
| CN | 201357293 Y | 12/2009 |
| CN | 101407004 A | 11/2010 |
| FR | 2746046 | 9/1997 |
| JP | 2007245185 A | 10/2011 |
| JP | 2006281315 A | 4/2012 |
| JP | 2007331006 | 9/2012 |
| KR | 20090040856 A | 4/2009 |
| RU | 2294272 C1 | 2/2007 |
| RU | 2009125088 A | 4/2011 |
| WO | WO 2014063222 A1 * | 5/2014 |

OTHER PUBLICATIONS

Novel Approaches to the Repair of Vane Segments, International Gas Turbine and Aeroengine Congress and Expostion, Cincinnati, Ohio, May 24-27, 1993.

Effect of Filler Alloys on Heat Affected Zone Cracking in Pre-weld Heat Treated IN-738 LC Gas-Tungsten-Arc Welds; Metallurgical and Materials Transactions, vol. 36A, Jul. 2005 2005.

Weldability Studies of High-Cr, Ni-base Filler Metals for Power Generation Applications, Welding in the World, vol. 55, N 3/4, Alexandrov B.T. et al. 2011.

Welding Brazing, and Soldering, ASM Handbeok, vol. 6 1993.

* cited by examiner

US 10,702,953 B2

COMPOSITE WELDING WIRE AND METHOD OF MANUFACTURING

This application is a continuation-in-part of prior application U.S. application Ser. No. 14/515,001 filed on Oct. 15, 2014 which is a continuation of Canadian No. PCT/CA2012/000980, filed Oct. 24, 2012, by Liburdi Engineering Limited under the title: A COMPOSITE WELDING WIRE AND METHOD OF MANUFACTURING with inventors: Goncharov, Alexander B.; Liburdi, Joseph; Lowden, Paul; Hastie, Scott.

FIELD OF THE INVENTION

The invention relates to filler materials for fusion welding which can be used for repair of turbine engine components manufactured of nickel, cobalt and iron based superalloys utilizing gas tungsten arc (GTAW) welding, laser beam (LBW), plasma (PAW) and micro plasma (MPW) manual and automatic welding.

BACKGROUND OF THE INVENTION

Several generations of nickel and cobalt-base superalloys have been developed for turbine engines. However, despite superior mechanical and oxidation resistance properties, engine components manufactured of precipitation hardening superalloys are still prone to thermal fatigue cracking, oxidation, sulfidation and erosion.

For a repair of heavily damaged engine components Liburdi Engineering Ltd. developed and patented Liburdi Powder Metallurgy process (LPM™) first described in the U.S. Pat. No. 5,156,321 in 1992.

The LPM™ process is based on the application of a putty made of Mar M-247, Inconel 738 or other superalloys powder with organic binder to the repair area followed by sintering of the powder at temperatures exceeding 1000° C. to produce a porous compound that is metallurgicaly bonded to the substrate followed by liquid phase sintering of LPM™ to the repair area using low melting nickel or cobalt based alloys that forms in the repair area a deposit with superior mechanical and oxidation properties.

General Electric developed and introduced similar processes known as Activated Diffusion Healing (ADH) that was described in the article "Improving Repair Quality of Turbine Nozzles Using SA650 Braze Alloy", by Wayne A. Demo, Stephen Ferrigno, David Budinger, and Eric Huron, Superalloys 2000, Edited by T. M. Pollock, R. D. Kissinger, R. R. Bowman, K. A. Green, M. McLean, S. Olson, and J. J. Schim, TM.5, The Minerals, Metals & Materials Society, 2000, pp. 713-720.

In ADH repair, a slurry is applied to the repair area. The slurry is made of a high melting point superalloy powder, usually the same composition as the alloy being repaired, and the ADH alloy, which has lower melting point that is achieved by adding boron (B) or silicon (Si) powders. The slurry is mixed together and suspended in standard organic-based brazing binders.

ADH alloys have achieved their low melting point primarily using boron. The boron level is balanced between a minimum that is required for braze flow, acceptable crack filling, and reasonably low braze process temperature on one side, against excessive deleterious impact on mechanical properties on the other side.

In both ADH and LPM processes the repair area includes a significant amount of low melting material, which make it extremely difficult to do following repairs or rework of any defects by fusion welding using conventional filler materials. As a result, for repair of even minor discontinuities LPM™ and ADH cycles have to be repeated increasing the cost of a repair and affecting properties of a parent material due to excessive diffusion of boron.

Joe Liburdi et al reported some progress in using of a GTAW welding with Inconel 625 filler wires for repairing of LPM™ materials in "Novel Approaches to the Repair of Vane Segments" at the International Gas Turbine and Aero-engine Congress and Exposition, Cincinnati, Ohio—May 24-27, 1993, Published by the American Society of Mechanical Engineers, 93-GT-230. However, the practical use of this method was limited due to inconsistency mostly because of a high melting temperature of Inconel 625 that exceeded a melting temperature of brazing materials used in the LPM process.

Additionally the direct GTAW welding on Inconel 738, Inconel 713, Rene 77 and other superalloys with a total content of aluminum and titanium exceeding 8% results in cracking of the heat affected zone (HAZ).

Previous attempts to produce crack free welds on Inconel 738 using standard filler wires were not successful in accordance with Banerjee K., Richards N I., and Chaturvedi M. C. "Effect of Filler Alloys on Heat Affected Zone Cracking in Pre-weld Heat Treated IN-738 LC Gas-Tungsten-Arc Welds", Metallurgical and Materials Transactions, Volume 36A, July 2005, pp. 1881-1890. The effect of nickel based Hastelloy C-263 welding wire manufactured to Aerospace Materials Specification (AMS) 5966 and comprised of 0.4% Si among other alloying elements, and silicon and boron free nickel based AMS 5832 (also known as Inconel 718), AMS 5800 (Rene 41), AMS 5675 (FM-92) welding wires having different melting temperatures and chemical compositions on HAZ cracking was studied. It was shown that all samples produced using above mentioned filler materials exhibited extensive cracking leading to conclusion that the weld metal solidification temperature range did not correlate with susceptibility of Inconel 738 alloy to HAZ cracking.

To verify results above, the inventors within the scope of the current development conducted the evaluation of weldability of Inconel 738 with another group of welding materials that included standard AMS 5786 (Hastelloy W) and AMS 5798 (Hastelloy X) nickel based welding wires comprised numerous alloying elements including Si with the bulk contend of 1 wt. %, Haynes HR-160 nickel based welding wire with bulk content of silicon of 2.75 wt. % and other wilding wires wherein the bulk content of silicon varied from 0.05 wt. % to 2 wt. % similar to the alloy described in U.S. Pat. No. 2,515,185.

Regardless of the chemical composition, all welds produced using standard welding wires exhibited extensive intergranular micro cracking in the HAZ along the fusion line between base material and weld bead. The HAZ cracking in Inconel 738 was related to an incipient melting of low temperature eutectics, carbides and other precipitates along grain boundaries during welding followed by a propagation of cracks due to continuously raising level of tensile residual stresses in the HAZ during solidification and cooling of the weld bead.

Lack of low temperature eutectics and rapid cooling did not allow full crack back filling as it was shown by Alexandrov B. T., Hope A. T., Sowards J. W., Lippold J. C., and McCracken S. S, Weldability Studies of High-Cr, Ni-base Filler Metals for Power Generation Applications, Welding in the World, Vol. 55, n° 3/4, pp. 65 76, 2011 (Doc. IIW-2111, ex. Doc. IX-231.3-09). High melting temperatures of standard cobalt based welding materials with bulk content of Si up to 2.75% that exceeded the incipient melting temperature of Inconel 738 increased overheating and aggravated cracking in the HAZ. The post weld heat treatment (PWHT) of these welds resulted in an additional strain-aging cracking in the HAZ. Some cracks propagated into welds.

Therefore, currently only preheating of Inconel 738, Inconel 713, GTD 111, GTD 222, Rene 80 and other precipitation hardening polycrystalline and directionally solidified high gamma-prime superalloys, as well as Mar M247, Rene 80, CMSX 4, CMSX 10, Rene N5 and other single crystal materials to temperature exceeding 900° C. allows crack free welding. Methods using elevated temperatures for welding are taught in U.S. Pat. Nos. 5,897,801, 6,659,332 and CA 1207137. However, preheating of parts prior to welding increases cost and reduces productivity of welding operations.

Based on the foregoing a different approach to welding of superalloys is desirable which is able to minimize or eliminate the requirement for preheating and is able to minimize or eliminate HAZ cracking. We have found that by selectively segregating certain elements superior weldability of superalloys and properties of welded joints can be achieved by taking advantage of the differences in the melting (liquidus) and solidification (solidus) temperatures sometimes referred to as the melting or solidification range.

There are several types of composite welding wires know from prior art. For example, the composite weld wire disclosed in U.S. Pat. No. 5,569,546 is made by sintering powders namely a mixture by weight of about 50-90% Co base alloy and about 10-50% Ni base alloy consisting essentially of 1.5-2.5% B, 2-5% Al, 2-4% Ta, 1447% Cr, 8-12% Co, with the balance of Ni and incidental impurities in powder form. Boron is used as a melting point depressant allowing welding of articles manufactured of cobalt based alloys. However, boron reduces ductility of cobalt, nickel and iron based alloys. Therefore this patent teaches the manufacturing of this filler wire by sintering powders. This is a costly and time consuming process to carry out in practice.

The flux-cored welding wires and wires that are described in the AMS Handbook, Welding, Brazing and Soldering, Volume 6, pp. 719, FR2746046, CA 2442335, and CN 1408501 also belong to the general class of composite filler materials. The flux-cored welding wires and wires comprise a metal shell that is filled with different slag forming materials, arc stabilizers, dioxidizers, and metal powders. Composite core wire can be manufactured of unlimited variations of powders using high productivity processes. Unfortunately, diameters of these filler materials vary from 4 to 8 mm that does not allow using them for repair and manufacturing of turbine engine components with wall thickness from 1 to 3 mm.

The bimetal composite welding wire has a good metallurgical bonding between the core and shell but it can be manufactured by drawing as per RU 2122908 using only high ductility materials such as copper and stainless steel.

The composite copper plated welding wire is disclosed in JP 2007331006, JP 2006281315, JP 62199287 and KR 20090040856. These wires have different chemical composition and are available on the global market from different suppliers. However, copper drastically reduces the service temperature of welded joints of nickel based superalloys. Therefore, they are not suitable for repair of turbine engine components.

The silver-copper coating of welding wires as per CN 1822246 due to metallurgical peculiarities of interaction with nickel and cobalt based superalloys, also are not suitable for weld of turbine engine components as well.

Titanium surface coating as per CN 101407004, CN 201357293 and JP 2007245185 is not effective for reducing the melting temperature of filler materials.

Coating of welding wire with active agent made of $MnCl_2$, $CaCl_2$, $MnO_2$, and ZnO as per CN 101244489 is not effective for HAL crack prevention of welding of precipitation hardening superalloys.

Composite welding wires and wires as per CN 1822246, RU 2415742 and RU 2294272 with inner and outer coatings containing activating fluxes aimed to reduce moisture absorption. These composite wires may also include metal coating. However, these filler wires are not able to produce defect free welds on precipitation hardening superalloys due to the high melting temperature and overheating of the heat affected zone due to hygroscopic components that do not reduce the melting temperature.

Therefore, due to technological difficulties in manufacturing and use of known filler wires, there is little to no availability of filler wires or wires which include a high content of melting point depressant for weld repair of turbine engine components by GTAW welding. Additionally currently no filler wires are available to produce crack free welds on Inconel 738 and other high gamma prime superalloys without preheating. Only AMS 4777 is commercially available in form of brazing cast rods. However, due to the low melting temperature of these rods, they are not suitable for repair of high pressure turbine (HPT) engine components.

Based on the foregoing it would advantageous to develop an effective composite welding wire for fusion welding and TIG (GTAW) braze-welding on precipitation hardening superalloys that are prone to cracking in the HAL and that were exposed previously to brazing, LPM™ or ADH repairs.

BRIEF DESCRIPTION OF THE INVENTION

We have found that a composite welding wire constituting a ductile core wire that comprises at least one of Ni, Co, Fe group base alloys and an outer surface layer that is enriched with a melting point depressants selected of a group containing B, Si, or mixture of B and Si successfully produced welding on LPM™, ADH and a variety of a difficult to weld superalloys and brazed joints. The total B and Si in the core and outer surface, referred to herein as the bulk content of melting point depressant, in the composite welding wire ranges approximately between 0.1-10 wt %.

The Composite welding wire described herein is readily made by a combination of cold/hot drawing of the ductile core wire followed by the physical deposition and bonding of the required amount of B and Si only to the surface layer. Prior art attempts to include higher contents of B and Si is limited due to the severe reduction in ductility caused by the B and Si additions. As a result, welding wires with high contents of melting point depressants could only be manufactured by casting or sintering, which is not commercially cost effective. Additionally, these attempts did little to address the occurrence of HAZ cracking.

The composite welding wires described herein can be produced by coating or painting of commercially available standard welding wires/rods with B and Si. The coatings may be followed by a heat treatment. The use of standard welding wires minimizes production costs. Therefore the present concept results in lower costs and high productivity, with these filler wires.

Surface alloying of core wire with B and Si reduces the melting temperature and incrementally increases the solidification range also referred to as the melting interval. It was found that upon solidification any cracks that form self-heal due to the presence of lower solidus temperature eutectic alloys that are formed between dendrites during the solidification of the weld pool. Additionally there is no observed deterioration of properties in repaired components.

Si and B in new composite welding wires did not reduce ductility of welds allowing use of the developed welding wires for buttering.

Tensile strength of welded joints produced using composite B and Si modified welding wires on similar and dissimilar materials was often superior to the strength of welds produced using similar materials and some parent materials at: a temperature of 982 Deg. C. (1800 Deg. F.).

We observed the elimination of HAZ cracking on Inconel 738 and other difficult to weld superalloys that are prone to cracking while welded at an ambient temperature.

We observed the reduction of the cost of a repair of turbine engine components and other articles.

As per another preferable embodiment, the filler wire may include a transition layer between the ductile core wire and the surface layer, wherein the content of the melting point depressant is gradually reduced from maximum on the outer surface to the level originally present at the interface of the ductile core wire material and outer surface layer.

Tubular filler wires with a diameter exceeding of 4 mm may include melting point depressants deposited on an inner surface as well.

In accordance with another embodiment, tubular filler wires and rods may contain filler powder that include the melting point depressants and at least one of Ni, Co, Fe base and alloying elements selected of a group of Al, Ti, Zr, Hf, V, Nb, Ta, Cr, Mo, W, Cu, Y, Re, C, N elements.

A method of a manufacturing of the composite filler material includes the steps of preparation of the surface of the ductile core wire by chemical cleaning or other means, application of a slurry containing melting point depressant to the ductile core wire, drying the slurry followed by a heat treatment in a protective atmosphere or vacuum at a temperature above 900° C. but below the incipient melting temperature of the ductile core wire material for a period of time that is determined for each combination of a ductile core wire and melting point depressant by experiment, calculation or other means, following by cooling to an ambient temperature.

In accordance with other preferable embodiments, the enrichment of the surface layer with the melting point depressant is produced by boriding also known as boronizing using one of the following processes: electrolytic boriding, liquid boriding, pack boriding, gas boriding, plasma boriding, fluidized bed boriding, by a chemical vapour deposition (CVD), by a Physical. Vapour Deposition (PVD), by Electron Beam Physical Vapour Deposition.

DETAILED DESCRIPTION OF THE INVENTION

Definitions

Figure 1:
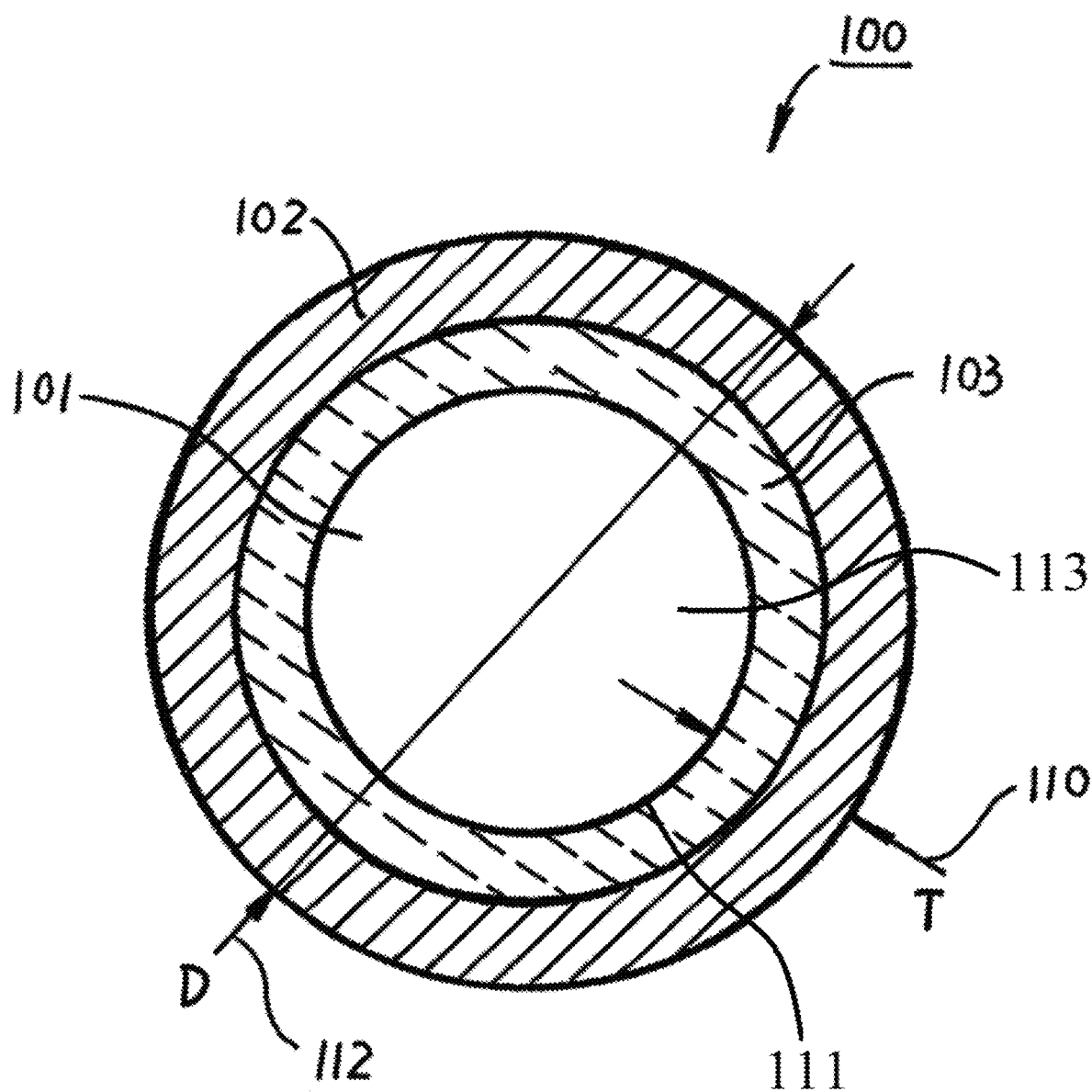
FIG. 1 depicts the cross section of the composite weld wire and includes ductile core wire 10, outer surface layer 102 that is enriched with melting point depressants and a transition layer 103, wherein D 112 is the outer diameter of the composite welding wire and T 110 is the thickness of the outer surface layer 102.

Binder: a material possessing properties enabling it to hold solid particles together to constitute a coherent mass of for example boron and/or silicon containing slurries and/or paints.

Organic Binder: binder comprising substantially all organic compounds.

Diffusion bonding: a material condition or process whereby due to a thermal activation, constituents such as for example B and Si spontaneously move into surrounding material such as the core wire material which has lower concentrations of these constituents. Diffusion may change the chemical composition and produce a transition or dissimilar interlayer.

Superalloys: Are metallic materials that exhibit excellent mechanical strength and resistance to creep at high temperatures, up to 0.9 melting temperature; good surface stability, oxidation and corrosion resistance. Superalloys typically have a matrix with an austenitic face-centered cubic crystal structure. Superalloys are used mostly for manufacturing of turbine engine components.

Nickel based superalloys: materials whereby the content of nickel exceeds the content of other alloying elements.

Cobalt based superalloys: materials whereby the content of cobalt exceeds the content of other alloying elements.

Iron based superalloys: materials whereby the content of nickel exceeds the content of other alloying elements.

Adhesive bonding: also referred to as gluing; the act or process by which the surface layer and core wire are bonded together using a binder as glue.

Sintering: a process that results in bonding between particles and possibly also a parent material. Sintering for example can take place between B and Si particles which may be powder form. and also a core wire due to atom diffusion during heating at a temperature below a melting temperature. Atoms of B and Si may for example diffuse across boundaries of the particles and core wire bonding these together and creating one solid piece without melting of any of constituencies.

Welding Wire: A form of welding filler metal, normally supplied as coils or spools that may or may not conduct electrical current depending upon the welding process with which it is used.

Welding Rod: A form of welding filler metal if form or rods that may or may not conduct electrical current depending upon the welding process with which it is used. In this application the terms weld rod and weld wire are used interchangeably since the inventive concept applies equally to either a weld wire or weld rod.

GTAW—Gas Tungsten Arc Welding

Brazing: A process in which a filler metal is heated above its melting point and distributed by capillary action between closely fitted repair component faying surfaces. The repair components are not heated above their melting temperatures.

Braze Welding: A fusion welding process variation in which a filler metal, having a liquidus above 450° C. and below the solidus of the repair component metal, is used. Unlike brazing, in braze welding the filler metal is not distributed in the joint by capillary action.

Buttering: A surfacing variation that deposits surfacing metal on one or more surfaces to provide metallurgically compatible weld metal for the subsequent completion of the weld.

Heat Affected Zone: Also known as HAZ, is the portion of the base metal that has not been melted, but whose mechanical properties or microstructure have been altered by the heat of welding, brazing, soldering, or cutting.

Fusion Welding: Any welding process that uses fusion of the base metal to make the weld.

Solidus temperature—the highest temperature at which a metal or alloy is completely solid.

Liquidus temperature—the lowest temperature at which all metal or alloy is liquid.

Solidus—liquidus range or melting range also referred to as solidification range—the temperatures over which the metal or alloy is in a partially solid and partially liquid condition.

Description

The present invention is a composite welding the wire or rod for fusion welding shown generally as composite welding wire 100 and the method of making composite welding wire 100. Composite welding wires 100 are used for the repair of various articles, preferably for repair of turbine engine components, manufactured of Ni, Co and Fe based superalloys, directionally solidified and single crystal alloys that were previously repaired using ADH, LPM™ or high temperature brazing as well as superalloys that are prone to cracking in the HAZ while welded using standard welding materials.

Composite welding wires 100 include a ductile core wire 101 shown in FIG. 1 produced for example by a hot or cold drawing of ductile standard or custom produced nickel, cobalt and iron based alloys having required chemical composition. Composite welding wires 100 also includes a surface layer 102, which is enriched with melting point depressants, such as boron, silicon or combination of these two chemical elements. Core wire 101 has an outer surface 111 and may be a solid core wire 113 as depicted. The surface layer 102 may include a transition layer 103 depending upon the method of manufacture of the composite welding wire 100. In FIG. 1 the surface layer 102 includes transition layer 103 for a total thickness of the surface layer 102 of T 110. The total diameter of the composite welding wire 100 is shown as D 112.

Figure 2:
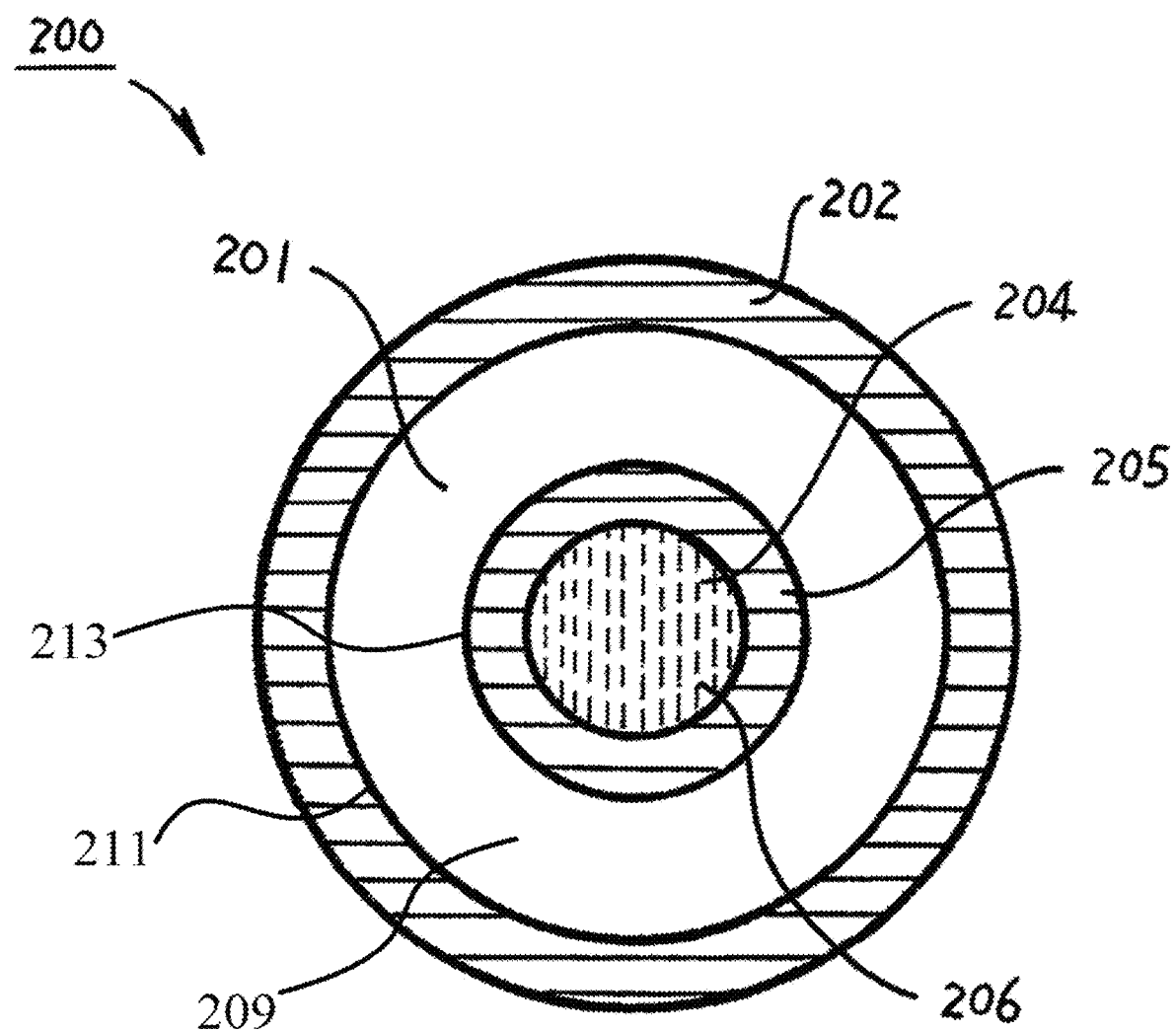
FIG. 2 depicts in cross sectional view a powder cored filler composite welding wire 200 which includes a ductile core wire 201 with the outer surface layer 202 that is enriched with melting point depressants, coaxial opening 204, inner surface layer 205 with melting point depressants, and wherein coaxial opening 204 may be filled with filler powder core 206.

FIG. 2 depicts in cross sectional view a weld wire which is a powder cored filler composite welding wire 200 which includes a ductile core wire 201 which may be a hollow tubular core wire 209 as depicted with the outer surface layer 202 that is enriched with melting point depressants, coaxial opening 204, inner surface layer 205 with melting point depressants, and wherein coaxial opening 204 may be filled with filler powder core 206. Hollow tubular core wire 209 includes an outer surface 211 and an inner surface 213.

To produce welding on variety of superalloys, ADH, LPM™ and brazed joints ductile core wires and rods are currently manufactured using standard and custom made nickel, cobalt, iron based wires.

Several examples of boriding are discussed below to produce the outer surface layer 102 and 202 shown in FIGS. 1 and 2 of a required thickness T 110.

For example a paste also known as slurry boriding, in which a mix of boronaceous medium made of boron powder with a volatile solvent such as alcohol or methanol or water is applied by brushing, or spraying or dipping onto the surface of core wires or rods.

Electrolytic boriding, in which the filler core wires are immersed into a melted boric acid ($H_3BO_3$) at a temperature of 950° C. with a graphite electrode that works as an anode, wherein boron atoms that are released due the electrochemical dissociation of boric acid, are absorbed by the core wire material.

Liquid boriding, in which the filler core wires are immersed into a salt bath. Pack boriding in which the boronaceous medium is a solid powder.

Gas boriding, in which the boronaceous medium is a boron-rich gases, such as $B_2H_2$—$H_2$ mixtures.

Plasma boriding, which also uses boron-rich gases at lower than gas boriding temperatures.

Fluidized bed boriding, which uses special boriding powders in conjunction with an oxygen-free gases such as hydrogen, nitrogen and their mixtures.

Boriding by a chemical vapour deposition (CVD), wherein boron atoms are diffused into core wires forming an intermetallic compounds on the surface of core wires in which the uniform diffusion of boronized layer is controlled by a thermo-chemical reactions.

Boriding by a Physical Vapour Deposition also knows as the PVD process, wherein the sputtering rich in boron material is evaporated by an electric arc in vacuum at working pressure of $10^{-2}$ torr or better. This process results in coating of the outer surface of core wires by boron atoms that diffuse at a high temperature into core wires producing coatings with a thickness that is regulated by a temperature of core wires and duration of the PVD process. Boriding by the Electron Beam Physical Vapour Deposition also known as the EB-PVD process which is similar to PVD but heating and evaporating of the sputtering material is performed by an electron beam.

Slurry, electrolytic and pack boriding are most cost effective for a manufacturing of the invented composite filler materials.

In paste boriding, the slurry containing boron powder and a easily vaporized. solvent is applied to the core wire by painting, spraying or dipping followed by drying at an ambient or elevated temperature in an oven if water was used to produce the slurry. Methanol is a preferable solvent due to easy evaporation at ambient temperature, low content of impurities, low health and safety hazardous and reasonable cost.

The required thickness of this coating depends on the core wire diameter and desirable chemical composition of melting point depressants.

The content of boron, silicon or boron and silicon in the surface layer and thickness of this layer should produce a bulk content of melting points depressants in a composite filler wire within a range of 0.1-10% reducing a melting temperature of this filler wire below the solidus-liquidus range of a brazing materials that were used to produce LPM™, ADH as well as to eliminate HAZ cracking of Inconel 713, Inconel 738, Rene 77 and other difficult to weld superalloys with a high content of gamma-prim (γ') phase. Bulk content is the B in surface layer+B in core wire. Bulk content refers to the total amount of an element in the composite welding wire.

The total amount of the low melting temperature depressants in the composite filler wire depends on the wire diameter and thickness of the outer surface layer that can be estimated using the equitation below:

$$C_\Sigma = \frac{D' \cdot C_{SL}}{T}$$

wherein:

$C_\Sigma$—total content of melting point depressants in the melted welding wire, $D'$—welding wire diameter, $C_{SL}$—content of melting point depressant in the surface layer T thickness of the surface layer.

After drying, the filler wire or rod with the applied slurry is subjected to a heat treatment in protective gasses (argon, helium or hydrogen) or in a vacuum to prevent oxidation of the melting point depressants at a temperature above 900° C. but below the melting temperature of the core wire material. This value can be found from available handbooks for each type of alloy. However, the best results were achieved in heat treatment within the temperature range of 1180-1205° C.

Figure 4:
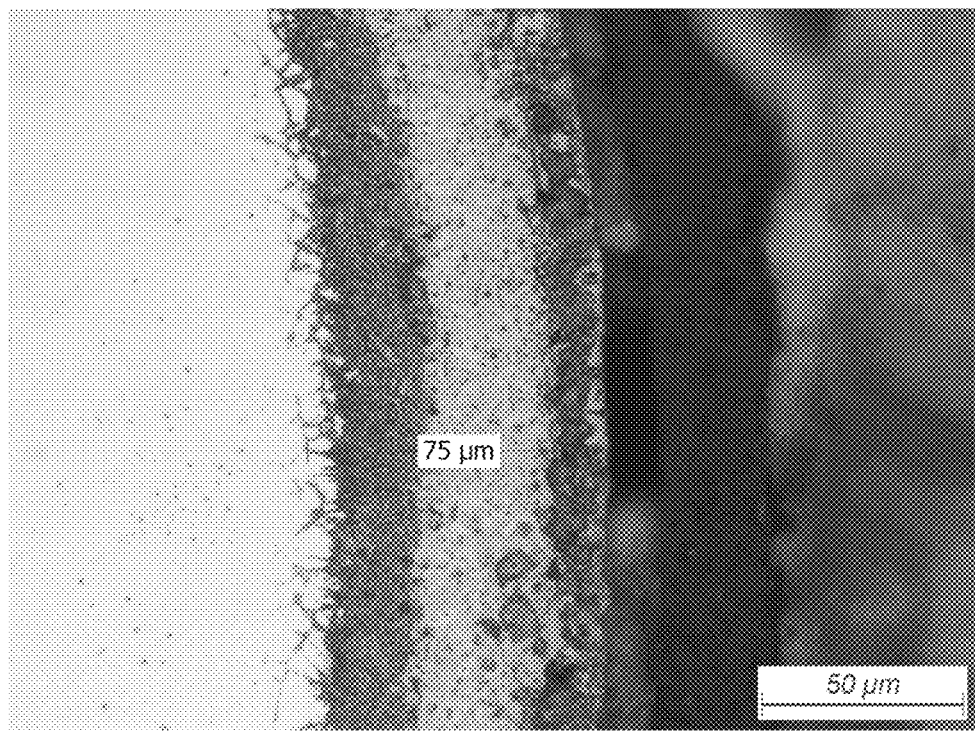
FIG. 4 is a macrograph of the cross section of the nickel based composite filler wire with the boron enriched surface layer produced by boriding.
Figure 5:
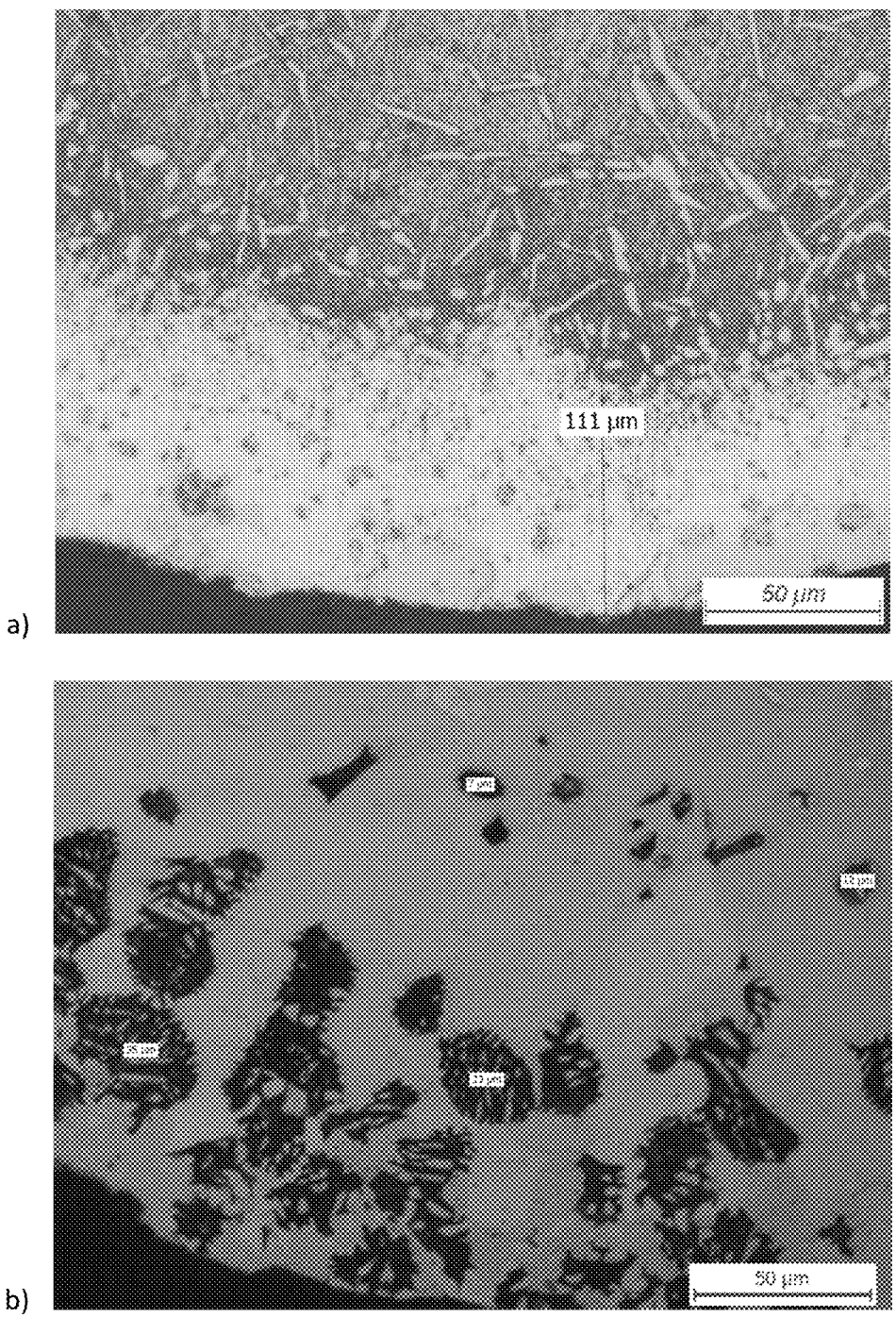
FIG. 5 is a micrograph of the cross section of the nickel based composite filler wire with the boron enriched surface layer (a) and silicon enriched surface layer (b) produced by an application of boron slurry to the surface of the core wire followed by a vacuum heat treatment at a temperature of 1200° C.

As shown in FIGS. 4 and 5 the heat treatment of filler wires within this temperature range produced the surface layers of thickness T=75-111 μm, which includes the transition layer 103. The content of boron reduces from a maximum on the surface to zero or to the original content of boron in the parent material at the parent material-transition layer interface.

Increasing the boriding time from 2 to 6 hours increases the thickness of the boronized layer to 140-250 μm. That is close to previously published by X. Dong et al "Microstructure and Properties of Boronizing Layer of Fe-based Powder Metallurgy Compacts Prepared by Boronizing and Sintering Simultaneously", Science of Sintering, 41 (2009) 199-207.

These surface layers exhibit excellent bonding with core wires allowing easy handling of composite filler weld wires and rods during welding.

The thickness of the boriding or boronizing layer is regulated by time and temperature of a heat treatment. During heat treatment boron diffuses into the substrate pwireucing a surface layer with a good bonding to the core wire.

In accordance with another example the formation of the outer surface layer containing boron is performed by utilizing the electrochemical process, wherein the core wires are immersed into melted boric acid at a temperature approximately of 950° C.

During boriding the boric acid dissociates releasing boron atoms that diffuse into the surface of ductile core wires forming $Ni_2B$ and other borides. During a post boriding heat treatment the metastable $Ni_2B$ borides are transformed into stable $Ni_3B$ compounds. Precipitation of borides, boride enrich solid solutions and phase containing up to 10% of boron takes place also on the surface of composite filler material and along grain boundaries.

Figure 3:
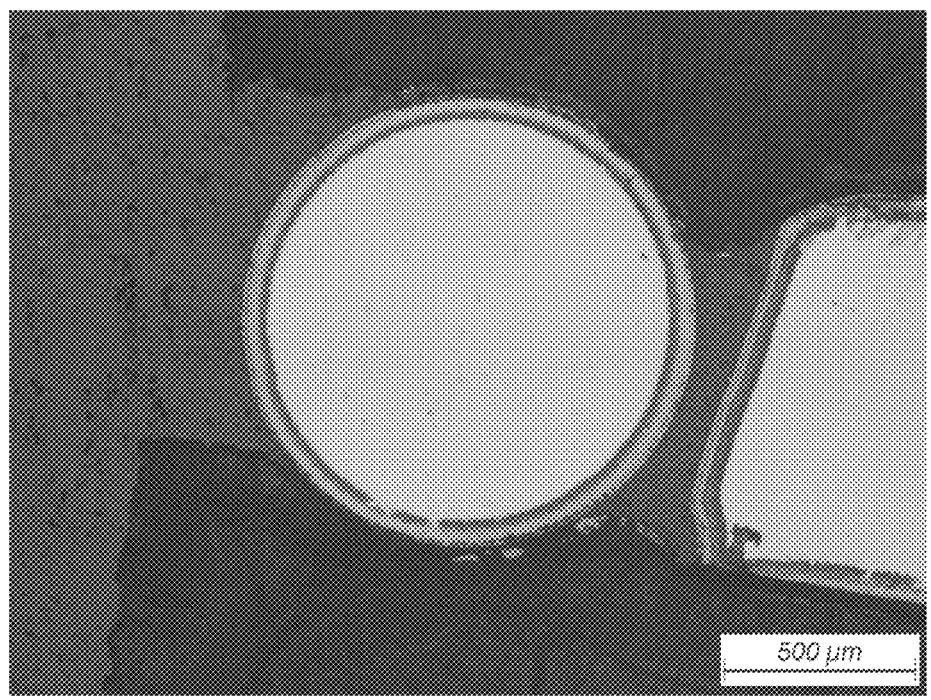
FIG. 3 is a macrograph of the cross section of the nickel based composite filler wire having the boron enriched surface layer produced by electrochemical boriding.

By experiment it was found, that during electrochemical boriding followed by a heat treatment within a temperature range of 900-1000° C. relatively thin boride layer is formed on the surface of filler wires. The thickness is approximately 75 μm or 0.075 mm of boriding layer shown in FIGS. 3 & 4.

As per another example, the outer surface layer containing melting temperature depressants is produced by pack boriding using Ekabor™ or similar powder comprised of 90% SiC, 5% $B_4C$, 5% $KBF_4$. During pack boronizing $B_4C$ is broken down to boron and carbon allowing boron diffusion into core wires.

Ductile core wires are placed in the intimate contact with the Ekabor powder and then heated to a temperature from 820-980° C. under a protective atmosphere of argon and held within the optimal temperature range that is selected for each base material by experiments. The soaking time depends also on base material of core wires, required. thickness of the surface layer and core wire diameter. The optimal heat treatment time is defined by experiments for each type of core wire alloys. After a diffusion cycle and cooling the excessive Ekabor powder is removed using soft stainless steel wire brush or other cleaning method.

Boriding also is carried out by CVD, PVD, EB-PVD and other processes using parameters developed for each type of material by experiments as well.

Silicon does not have the same diffusivity as boron. Therefore, the most efficient way to apply silicon is brushing, spraying or dipping ductile core wires into a silicon containing slurry followed by a diffusion heat treatment at a temperature of 1100° C.-1200° C.

In another embodiment the application of boron, silicon or boron-silicon powder or liquid paints are prepared using organic binders followed by electrostatic or brush painting followed by drying of welding wires. This produces an adhesive bond between the surface layer 102 and core wire 101 that allows automatic wire feeding for welding on nickel and cobalt based alloys that are not sensitive to carbon content or wherein additional alloying of welds with carbon is essential.

During welding organic binder is evaporated and decomposed releasing B and Si that are absorbed by the welding pool.

In Use

Composite welding wires were manufactured using slurries made of boron, silicon and boron-silicon powders with purity of 99% and a particle size of 1-5 µm and organic binders. Slurries were applied by brushing to standard welding wires AMS 5837, AMS 5839, AMS 5801, Rene 80 and Rene 142 of 1.0-1.5 mm in diameter, wherein AMS stands for Aerospace Material Specification. New name of composite welding wires and bulk content of alloying elements in wt. % shown below:)

a) Composite Welding Wire A (manufactured of AMS 5837: 20-22% Cr, 9-11% Mo, 3.5-4% Nb, 0.5-0.8% B. Ni and impurities to balance.

b) Composite Welding Wire B (manufactured of AMS 5839 wire): 21-23% Cr, 1.5-2.5% Mo, 13-45% W, 0.3-0.5% Al, 1.5-1.8% Si, 0.5-0.8% Mn, Ni and impurities to balance.

c) Composite Welding Wire C (manufactured of AMS 5801 wire): 21-23% Cr, 21-23% Ni, 14-15% W, 0.05-0.08% La, 0.5-0.8% B, 1.2-1.5% Si, Co and impurities to balance.

d) Composite Welding Wire D (manufactured of AMS 5694 wire): 23-25% Cr, 11-13% Ni, 1-2.5% B, 1.2-1.5% Si, Fe and impurities to balance.

After drying filler wires were subjected to a heat treatment in a vacuum with a minimum pressure of $10^{-4}$ ton within at a temperature range 1120 and 1205° C. at a soaking time of two (2) hours followed by a furnace cooling in vacuum.

Visual and metallographic examination of produced composite filler wires demonstrated formation of continues boriding layer with a thickness that varied from 105 to 175 µm. A typical microsturcture of a welding wire produced using this method is shown in FIGS. 4 and 5.

To demonstrate method of a manufacturing of the invented composite welding wires by painting, 100 grams of boron powder of 99% purity was mixed with 100 grams of acrylic based binder and 150 grams of solvent Dowanol™ solvent. This mixture was carefully stirred to obtain a uniform slurry with the required brush painting viscosity. The slurry was applied to welding wires of I mm in diameter by brush with two layers and left to dry for two hours. Drying resulted in evaporation of solvents, and a boron rich surface layer with excellent bonding to the core wire.

In another example of manufacturing of composite welding wires 60 grams of polyester resin were dissolved in 150 grams of pure acetone. This solution was vigorously stirred until full dissolution of polyester flakes followed by adding of 40 grams of Si powder with size of particles from 1 to 5 micrometers. Stirring was continued with adding of additional amount of acetone as required to obtain suitable for brush painting viscosity. Subsequently the welding wires were painted using a soft brush to apply layer and left in air to dry at an ambient temperature for 15 to 30 minutes. After evaporation of acetone, Si and polyester binder produced the uniform surface layer with good adhesion to the inner core wire that allowed easy handling of produced welding wires without damaging the uniformity of the Si surface layer.

Figure 13:
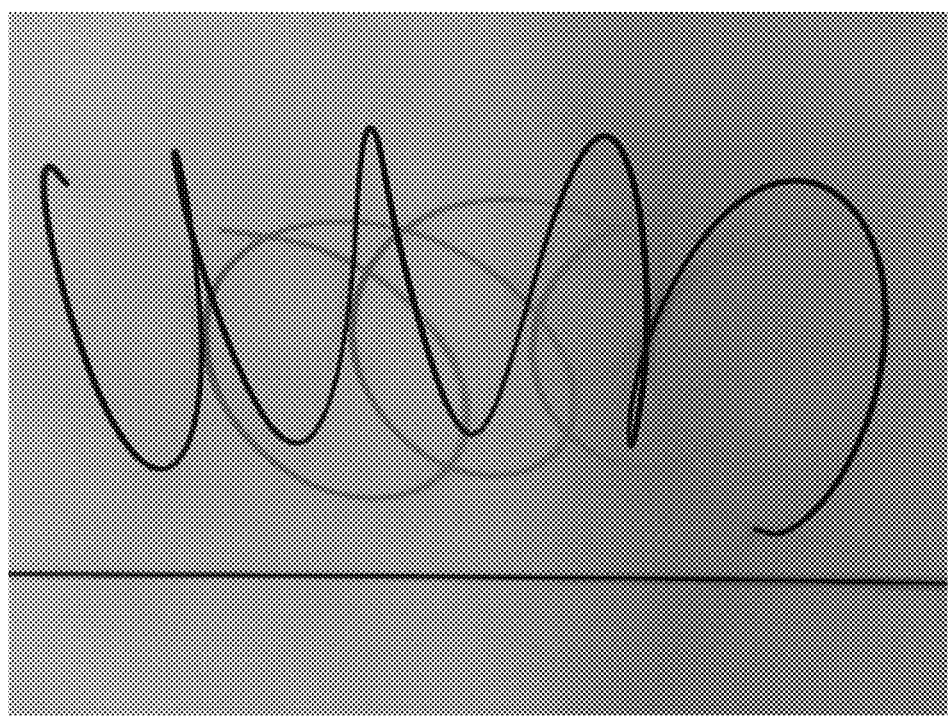
FIG. 13 depicts the sections of a spooled composite welding wire with the surface layer comprised 40% of boron and welding rod on the bottom with the surfaces layer comprised 12% or boron and the polyester binder to balance.

Composite welding wires in spools polyester powder paint with 10 to 45% B and polyester to balance was produced by the electrostatic painting method followed by oven curing at a temperature of 140-160° C. The thickness of the surface layer was regulated from 15 to 500 micrometers to produce welding wires with a bulk content of B from 0.1 to 10%. Standard equipment for the electrostatic powder paint was used. The sections of the spooled welding wire for the automatic GTAW welding is shown in FIG. 13.

Figure 8:
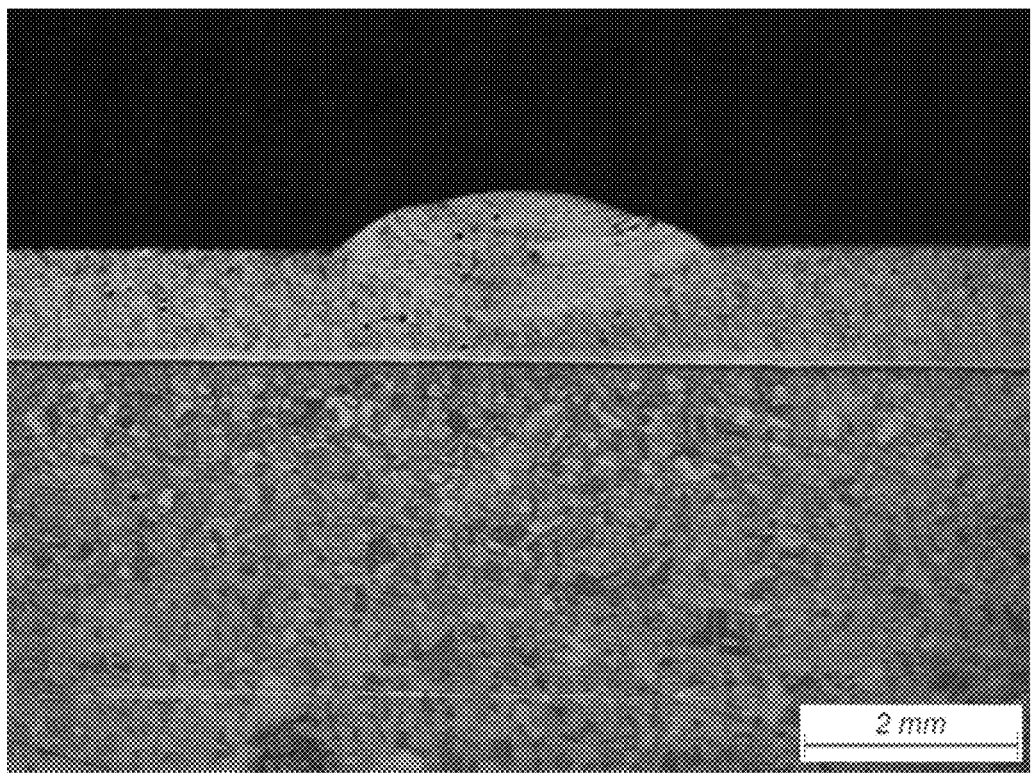
FIG. 8 is a micrograph of the sample shown in FIG. 7.

To demonstrate GTAW braze welding using the invented composite welding wires, experiments were performed using samples that comprised 304 stainless steel and Inconel 738 substrates and top layers LPM™ deposited according as shown in FIG. 8 of 1-4 mm in thickness and brazed joints produced by a high temperature brazing in a vacuum furnace using AMS 4777 brazing alloy.

Manual GTAW braze welding process was carried out using the standard CK welding torch with 1/16 inch in diameter non consumable tungsten electrode further the electrode and argon for a protection of the repair area from oxidation and invented composite filler materials in a form of wires of 1-1.5 mm in diameter. The welding current was regulated within range of 20-40 A and arc voltage varied from 9 to 12 V depending on a distance between the tungsten electrode and samples. After establishing of the welding pool, the heating of the LPM™ was performed throughout the layer of melted filler material preventing latter from overheating and cracking.

Composite welding wires with diameters between 1 and 2 mm were manufactured using electrostatic painting and brush application of B and Si paints. At this stage the wire is termed as being in the "green condition". The process is followed by diffusion heat treatment for more than three hours. The coating of the composite welding wire in the green condition contains only B, Si and sacrificial binder. The green coating is made of B and Si and a sacrificial organic binder wherein the binder is not more than. 50 wt. % of the coating. The coating in green condition comprises at least 50% of B and Si with sacrificial binder to balance. The B and Si in the green surface layer represents at least 70% and preferably at least 80% of the total bulk B and Si content of the composite welding wire. After heat treatment and formation of the diffusion layer, the coating is comprised of all alloying elements of the core wire in addition to B and Si. No sacrificial hinder is present in the coating after heat treatment and formation of the diffusion layer.

Composite Welding Wire Compositions

Wire A

Composite Welding Wire A (manufactured of AMS 5837 wire)

Cr: 20-22 wt %, Mo: 9-11 wt %, Nb: 3.5-4%, B: 0.5-0.8 wt %, Ni and impurities to balance Core wire B content=0.00 wt % and Si content 0.00 wt %

Wire B

Composite Welding Wire B (manufactured of AMS 5839 wire)

Cr: 21-23 wt %, Mo: 1.5-2.5 wt %, W: 13-15 wt %, Al: 0.3-0.5 wt %, Si: 1.5-1.8 wt %, n: 0.5-0.8 wt %, Ni and impurities to balance.

Core wire B content 0.00 wt % and Si content=0.25 wt %

Wire C

Composite Welding Wire C (manufactured of AMS 5801 wire)

Cr: 21-23 wt %, Ni: 21-23 wt %, W: 14-15 wt %, La: 0.05-0.08 wt %, B: 0.5-0.8%, Si: 1.2-1.5 wt %, Co and impurities to balance.

Core wire B content=0.00 wt % and Si content=0.20 wt %

Wire D

Composite Welding Wire D (manufactured of AMS 5694 wire)

Cr: 23-25 wt %, Ni: 11-13 wt %, B: 1-2.5 wt %, Si: 1.2-1.5 wt %, Fe and impurities to balance.

Core wire B content 0.00 wt % and Si content=0.30 wt %

Wire E

Composite Welding Wire E (manufactured from standard wire Rene 80)

Co: 9.5 wt %, Cr: 14 wt %, W: 4 wt %, Mo: 4 wt %, Al: 3 wt %, Ta: 3.3 wt %, Zr: 0.06 wt,

C: 0.17%, Ti: 5 wt %, Fe: 0.3 wt %, Si: 2.1 wt %, Ni and impurities to balance.

Core wire B content=0.015 wt % and Si content=0.00 wt %
  Wire F
Composite Welding Wire F (manufactured from standard wire Rene 142)
Co: 12 wt %, Cr: 6.8 wt %, W: 4.9 wt %, Mo: 1.5 wt %, Al: 6.1 wt %, Ta: 6.3 wt %, Zr: 0.02
wt %, C: 0.02 wt %, Re: 2.8 wt %, Ti: 1.0 wt %, Hf: 1.2 wt %, Mn: 0.2 wt %, Si: 1.88 wt %,
Ni and impurities to balance.
Core wire B content=0.015 wt % and Si content=0.00 wt %

CHART A

| Composite Welding Wire | Boron Bulk B Content in Composite Welding Wire, wt. % | Silicon Bulk Si Content in the Composite Welding Wire, wt. % | Total Bulk Boron and Silicon Content in the Composite Welding Wire, wt. % |
| --- | --- | --- | --- |
| A | 0.5-0.8 | Nil | 0.5-0.8 |
| B | Nil | 1.5-1.8 | 1.5-1.8 |
| C | 0.5-0.8 | 1.2-1.5 | 1.7-2.3 |
| D | 1-2.5 | 1.2-1.5 | 2.2-4 |
| E | 0.015 | 2.1 | 2.115 |
| F | 0.015 | 1.88 | 1.895 |

CHART B

| Composite Welding Wire | Boron | | Silicon | | | % of Boron + |
| --- | --- | --- | --- | --- | --- | --- |
| | Bulk B Content in Composite Welding Wire, wt. % | Boron* Content in the Original Core Wire, wt. % | Bulk Si Content in the Composite Welding Wire, wt. % | Silicon* Content in the Original Core Wire, wt. % | Total Bulk Boron and Silicon Content in the Composite Welding Wire, wt. % | Silicon in the Surface Layer Relative to Bulk B + Si Content in the Composite Welding Wire |
| A | 0.5-0.8 | Nil | Nil | Nil | 0.5-0.8 | 100 |
| B | Nil | Nil | 1.5-1.8 | 0.25 | 1.5-1.8 | 83.33-86.11 |
| C | 0.5-0.8 | Nil | 1.2-1.5 | 0.2 | 1.7-2.3 | 88.24-91.3 |
| D | 1-2.5 | Nil | 1.2-1.5 | 0.3 | 2.2-4.0 | 86.36-92.5 |
| E | 0.015 | 0.015 | 2.1 | Nil | 2.115 | 99.29 |
| F | 0.015 | 0.015 | 1.88 | Nil | 1.895 | 99.21 |

Weld Example 1

Figure 6:
FIG. 6 is a 304 stainless steel plate with a nickel based LPM™ top layer produced according to the teachings of U.S. Pat. No. 5,156,321 prior to welding.

Straight and circular coaxial V-grooves of 1-1.5 mm in depths were produced in nickel based LPM™ top layer that was applied on the 304 stainless steel plate as shown in FIG. 6.

Two circular coaxial welds were made to induce extremely high residual stress aiming to initiate cracking in LPM™ similar to testing of standard low ductile materials for susceptibility to weld cracking.

GTAW braze welding was made using the Composite Welding Wires A and B.

Figure 7:
FIG. 7 depicts the same sample after GTAW weld-brazing using the boron modified Composite Welding Wire A with chemical composition shown in Examples on LPM™.

As shown in FIG. 7, braze welding did not result in cracking of LPM™ deposit.

The micrographic examination of the repair area in "as welded" condition did not reveal cracks and other linear indications as shown in FIG. 8.

Figure 9:
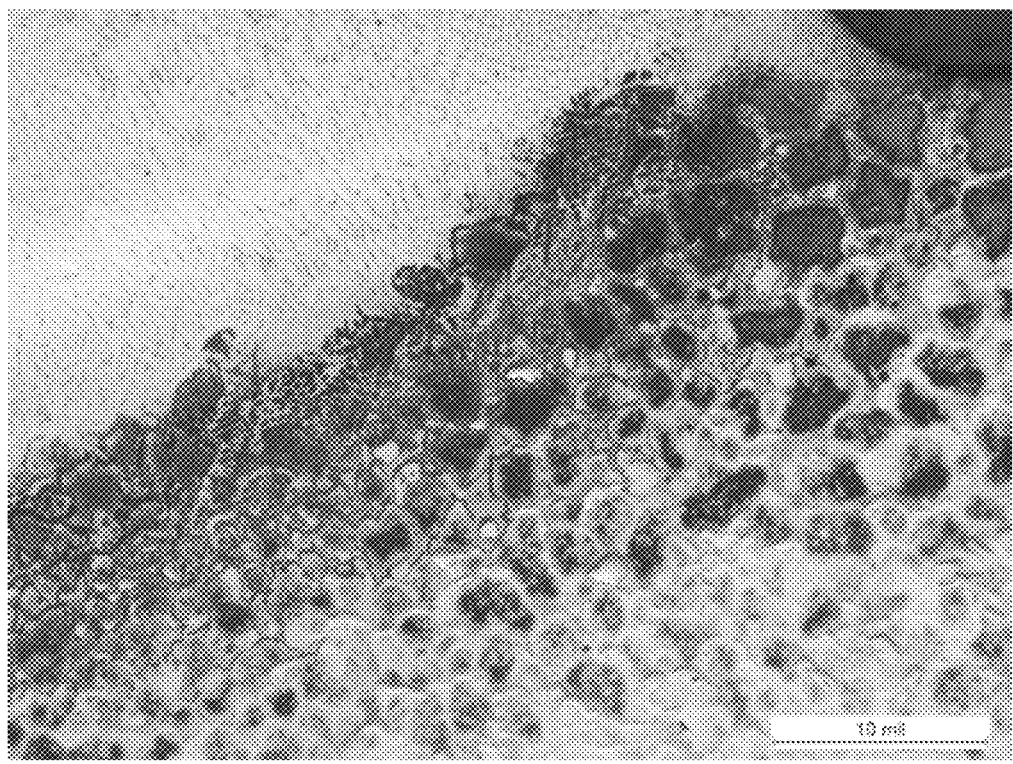
FIG. 9 is a micrograph of the fusion zone between the LPM™ deposit and boron modified Composite Welding Wire A with chemical composition shown in Examples.

The depth of the HAZ varied between 7-8 μm. No micro discontinuities were found in the HAZ as shown in FIG. 9 after a post weld heat treatment at a temperature of 1120° C.

Weld Example 2

Figure 10:
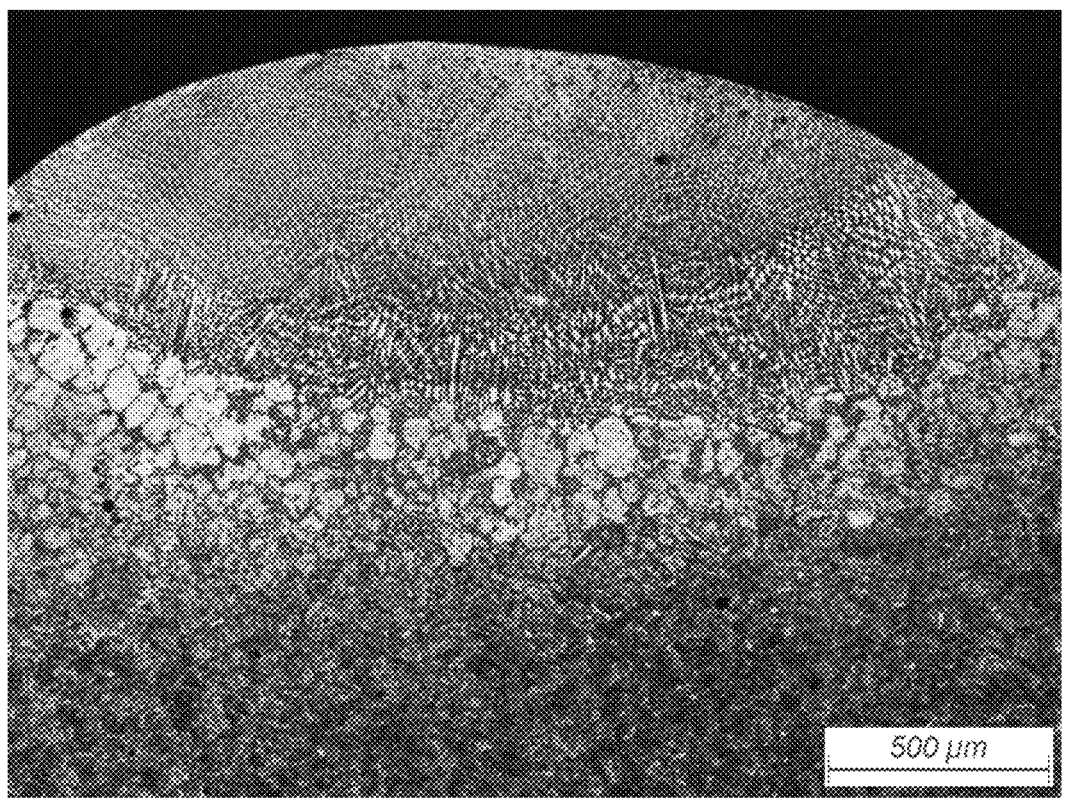
FIG. 10 is the micrograph of welds produced on the LPM™ deposit using the boron modified Composite Welding Wire B with chemical composition shown in Examples.

To establish reparability of LPM™ and Inconel 738 precipitation hardening difficult to weld superalloy high pressure turbine (HPT) blades with the LPM™ layer on the concave side of airfoils was GTAW welded as described above using Composite Welding Wires B. refer to FIG. 10.

GTAW welding was also made on the convex side of blades directly on Inconel 738 alloy using the same filler material.

Figure 11:
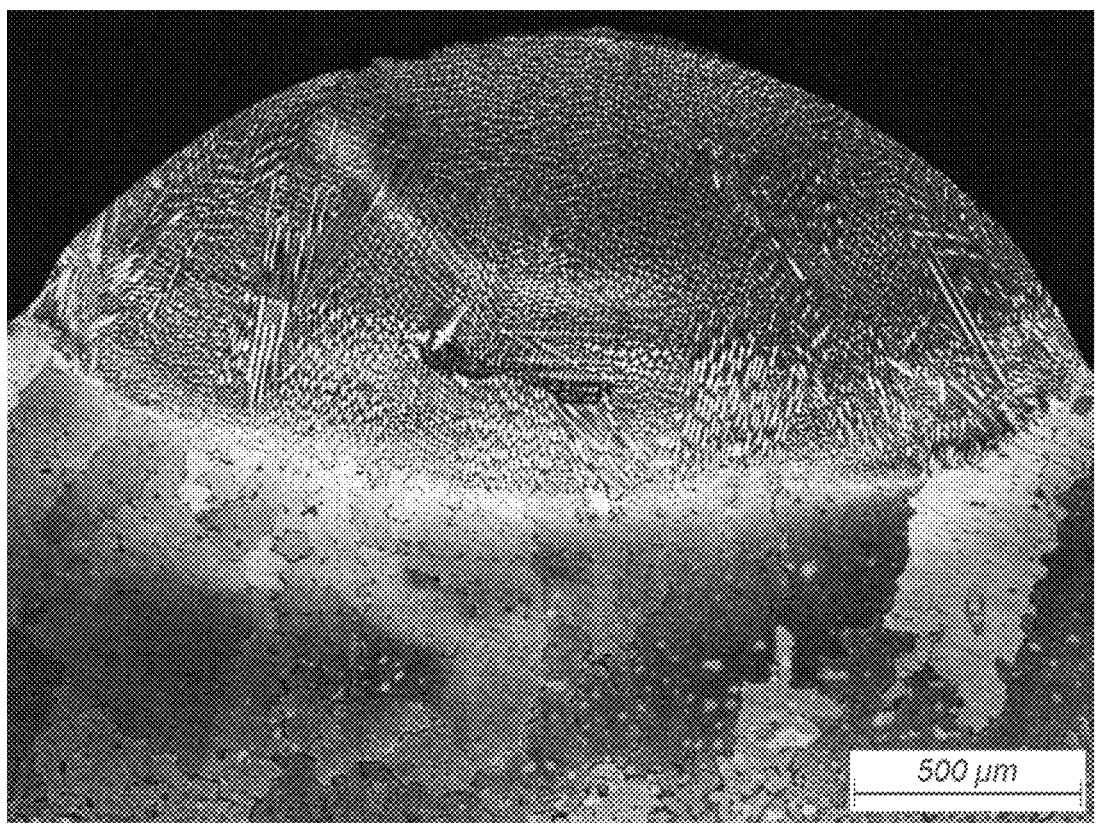
FIG. 11 depicts the crack free welds produced on Inconel 738 alloy using the boron modified Composite Welding Wire B with chemical composition shown in Examples.

Metallographic examination of weld beads produced by GTAW braze welding on LPM™ and Inconel 738 did not reveal any unacceptable linear discontinuities as shown in FIG. 11 in as welded condition and after heat treatment at a temperature of 1120° C.

Weld Example 3

Successful repair of cracks on Rene 77 nozzle guide vane (NGV) was made using manual GTAW welding with Composite Welding Wires C and welding current of 50-60 A.

Non distructive testing (NDT) and metallographic examination did not reveal any cracks along the fusion zone in 'as welded' condition and after heat treatment at a temperature of 1205° C. for two (2) hours followed by the argon quench.

Figure 12:
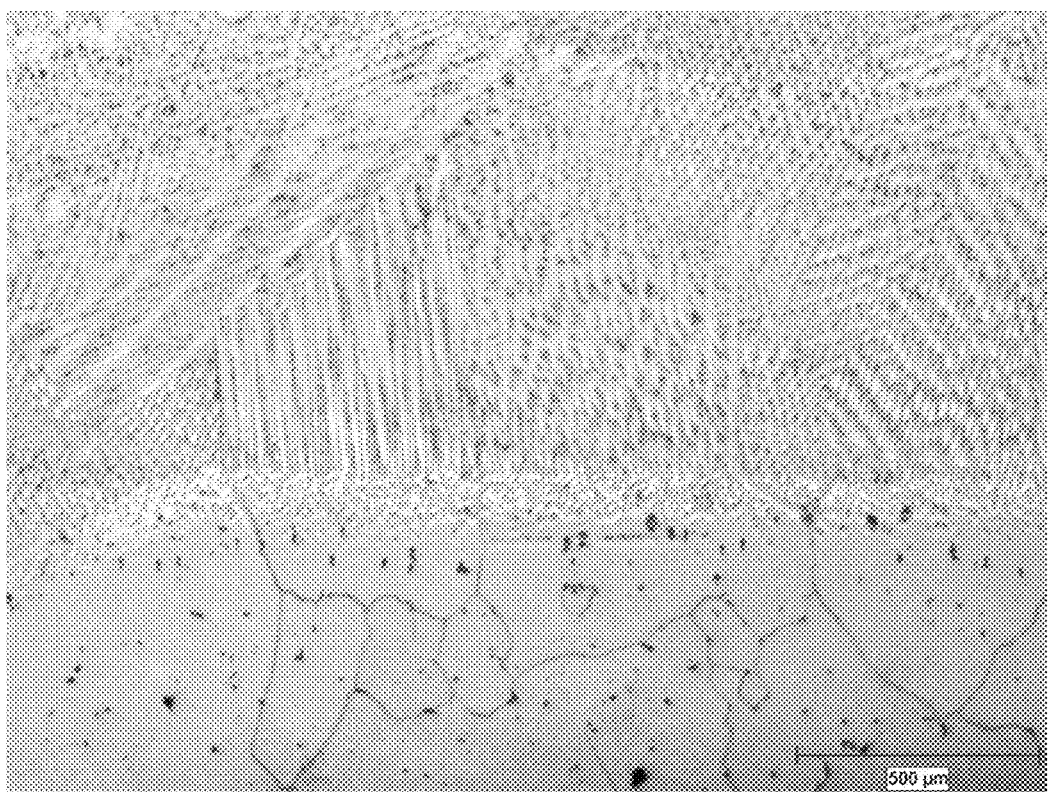
FIG. 12 is the micrograph of the weld produced using silicon modified Composite Welding Wire C with chemical composition shown in examples regarding Rene 77.

Typical micrograph of a weld is shown in FIG. 12

Weld Example 4

Successful weld build up on 304 stainless steel substrate using GTAW welding with Composite Welding Wires D and welding current of 40-50 A was carried out demonstrating applicability of the invented composite filler wires for cladding on ferrous materials (stainless steels). NT)T and metallographic examination did not reveal any cracks along the fusion zone and weld beads in 'as welded' condition.

Welding Examples 5 & 6

Composite Welding Wires E and F were manufacture by the application of silicon based slurry to standard welding wires Rene 80 and Rene 142 respectively followed by a vacuum heat treatment at a temperature of 1200° C. for two (2) hours. After heat treatment Composite Welding Wires comprised following below chemical elements in wt. %.

Composite Welding Wires E: 9.5 wt % Co, 14% wt Cr, 4 wt % W, 4 wt Mo, 3 wt % Al, 3.3 wt % Ta, 0.06 wt Zr, 0.17% C, 5 wt % Ti, 0.3 wt % Fe, 2.1 wt % Si, Ni and impurities to balance. Composite Welding Wire F: 12 wt % Co, 6.8 wt % Cr, 4.9 wt % W, 1.5 wt % Mo, 6.1 wt % Al, 6.3 wt % Ta. 0.02 wt % Zr, 0.02 wt % C, 2.8 wt % Re, 1.0 wt % Ti, 1.2 wt % Hf, 0.2 wt % Mn, 1.88 wt % Si, Ni and impurities to balance.

Manufactured Composite Welding Rods E and F were used for manual GTAW butt welding of Inconel 738 and Mar M002 bars of 0.50 inch in diameter. Welding was made without any preheating at ambient temperature. Welding parameters were developed to control dilution below 40%.

Welded joints were subjected to two stages standard aging heat treatment in vacuum at a temperature of 1120° C. for two (2) hours followed by 845° C. for twenty four (24) hours and argon quench.

Standard round samples were manufactured and subjected to tensile testing at a temperature of 982° C. as per ASTM E21.

Prior to mechanical testing samples were subjected to radiographic inspection. No indications exceeding 0.1 mm in size where found.

Rupture testing of samples was made a temperature of 982° C. at stresses of 22 KSI as per ASTM E-139.

Mechanical properties of Inconel 738 standard alloy and welding joints are shown in the Table 1.

Table 1. Mechanical Properties of Inconel 738 Alloy and Welding Joints Produced on Inconel 738 and Mar M002 Using Composite Welding Wires E and F at a Temperature of 982° C.

| Material Being Tested | Tensile, UTS, KSI | Tensile, Yield, KSI | Tensile, Elongation, % | Rupture*, Hours | Rupture, Elongation, % |
| --- | --- | --- | --- | --- | --- |
| Incone 738 (base material) | 49.35 | 36.85 | 15.55 | 19.8 | 9.15 |
| Inconel 738 Welded joints produced using Composite Welding Wire E | 52.4 | 38 | 21.5 | 16.15 | 6.55 |
| Mar M002 Weld Joints produced using Composite Welding Wire F | 80.95 | 60.95 | 9.35 | 173.3 | 12 |

Note:
Results are average of two tests.

As follows from Table 1 welded joints produced using Composite Welding Wires E and F at an ambient temperature were free of cracks and had superior mechanical properties, while GTAW butt welding of Inconel 738 without preheating resulted in extensive cracking of weld beads and HAZ.

The present invention has been described in a connection with most typical examples and embodiments. However, it will be understood by those skilled in the art that the invention is capable of other variations and modifications without departing from its scope as represented by the appended claims. The above are hereby incorporated by reference.

We claim:

1. A composite welding wire for fusion welding of components manufactured of superalloys, the composite weld wire comprises:
   a) a coated core wire configured for fusion welding of components manufactured of superalloys;
   b) the coating includes a surface layer applied to the core wire in a green condition and bonded to the core wire;
   c) the surface layer includes alloying elements which act to depress the melting point of a weld pool during welding, the alloying elements selected from a combination of B and Si in the surface layer, wherein the combination has a total bulk content of B and Si in representing 0.5 to 4.0 wt. % of the composite welding wire, wherein the boron and silicon alloying elements reduce the melting temperature and increase the solidification range of the weld pool and adapted to minimize the incidence of weld cracking compared to welding without the coating; and
   d) wherein the green condition surface layer comprises more than 80% wt. % of the bulk content of the composite wire of the alloying elements selected from the combination of B and Si.

2. The composite welding wire claimed in claim 1 wherein in a green condition the surface layer consists of at least 50 wt. % of a combination of B and Si with a sacrificial organic binder to make up the balance of the surface layer.

3. The welding wire claimed in claim 1 wherein the total bulk content of B does not exceed 2.5 wt. %.

4. The welding wire claimed in claim 1 wherein the total bulk content of Si does not exceed 2.1 wt %.

5. The welding wire claimed in claim 1 wherein the total bulk content of B is 0.5 to 0.8 wt % and the bulk Si content is 0 wt %.

6. The welding wire claimed in claim 1 wherein the total bulk content of Si is 1.5 to 1.8 wt,% and the bulk B content is 0 wt %.

7. The welding wire claimed in claim 1 wherein a thickness T of the surface layer being less than 25% of a total diameter D of the weld wire.

8. The welding wire claimed in claim 1 wherein the surface layer is adhesively bonded to the core wire, selected from among: adhesively bonding, sintering in the solid state, and metallurgically bonding by diffusion bonding.

9. The welding wire claimed in claim 1 further including a transition layer sandwiched between the core wire and the surface layer.

10. The welding wire claimed in claim 9 wherein the surface layer is metallurgically bonded to the core wire by diffusion bonding of B and Si into the core wire.

11. The welding wire claimed in claim 1 wherein the surface layer is metallurgically bonded to the core wire by a diffusion bonding method selected from among; solid diffusion, solid-liquid diffusion, and liquid diffusion.

12. The welding wire claimed in claim 8 wherein the adhesive bonding is carried out in a temperature range from 30° C. to 500° C.

13. The welding wire claimed in claim 8 wherein the sintering bonding is carried out in a temperature range from 500° C. to 900° C.

14. The welding wire claimed in claim 8 wherein the metallurgical bonding is carried out in a temperature range from 900° C. to 1400° C. and below of a melting temperature of the core wire.

15. The welding wire claimed in claim 1 wherein the core wire composition is selected from among nickel based alloys, nickel based superalloys, cobalt based alloys, cobalt based superalloys, iron based alloys, iron based superalloys.

16. The welding wire claimed in claim 1 wherein the core wire is a solid core wire and the surface layer is applied to an outer surface of the solid core wire.

17. The welding wire claimed in claim 1 wherein the core wire is a hollow tubular core wire and wherein the surface layer is applied to an outer surface of the hollow tubular core wire.

18. The welding wire claimed in claim 17 wherein the surface layer is applied to an inner surface of the hollow tubular core wire.

19. The welding wire claimed in claim 17 wherein the surface layer is applied to an inner surface of the hollow tubular core wire and applied to an outer surface of the hollow tubular core wire.

20. The welding wire claimed in claim 17 wherein the surface layer is bonded to the core wire by selected from among adhesively bonded, sintering in the solid state, and by diffusion bonding.

21. The welding wire claimed in claim 5 wherein the surface layer comprises an organic binder, wherein the binder is selected from among the following synthetic or natural resins: acrylics, polyesters, epoxy, vinyl-acrylics, vinyl acetate-ethylene (VAE), melamine resins, epoxy, alkyds, and oils.

22. The welding wire claimed in claim 1 wherein the surface layer is applied using a method selected from among; painting, electrostatic powder painting, slurry coating, boriding, chemical vapour depositing, physical vapour depositing, electron beam depositing, and electron beam physical vapour depositing.

23. The welding wire claimed in claim 1 wherein the total bulk content of B is 0.5 to 0.8 wt % and the bulk Si content is 1.2 to 1.5 wt %.

24. The welding wire claimed in claim 1 wherein the total bulk content of B is 1.0 to 2.5 wt % and the bulk Si content is 1.2 to 1.5 wt %.

* * * * *